United States Patent
Dunn (10) Patent No.: US 8,373,841 B2
(45) Date of Patent: Feb. 12, 2013

(54) SHARED ISOLATED GAS COOLING SYSTEM FOR OPPOSITELY FACING ELECTRONIC DISPLAYS

(75) Inventor: William Dunn, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 825 days.

(21) Appl. No.: 12/556,029

(22) Filed: Sep. 9, 2009

(65) Prior Publication Data

US 2010/0226091 A1    Sep. 9, 2010

Related U.S. Application Data (63) Continuation-in-part of application No. 11/941,728, filed on Nov. 16, 2007, now Pat. No. 8,004,648, which is a continuation-in-part of application No. 12/191,834, filed on Aug. 14, 2008, now Pat. No. 8,208,115, and a continuation of application No.

(Continued)

(51) Int. Cl.
    *G02F 1/1333* (2006.01)
    *G02F 1/1347* (2006.01)
(52) U.S. Cl. ............... 349/161; 349/58; 349/74
(58) Field of Classification Search ........... 349/161
    See application file for complete search history.

(56) References Cited

U.S. PATENT DOCUMENTS

| 4,093,355 A | 6/1978 | Kaplit et al. |
| 4,593,978 A | 6/1986 | Mourey et al. |
| 4,634,225 A | 1/1987 | Haim et al. |
| 5,029,982 A | 7/1991 | Nash |
| 5,088,806 A | 2/1992 | McCartney et al. |
| 5,247,374 A | 9/1993 | Tereda |
| 5,559,614 A | 9/1996 | Urbish et al. |
| 5,748,269 A | 5/1998 | Harris et al. |
| 5,767,489 A | 6/1998 | Ferrier |
| 5,818,010 A | 10/1998 | McCann |
| 5,869,919 A * | 2/1999 | Sato et al. ............ 313/17 |
| 5,991,153 A | 11/1999 | Heady et al. |

(Continued)

FOREIGN PATENT DOCUMENTS

| GB | 2402205 | 1/2004 |
| JP | 03153212 | 7/1991 |

(Continued)

OTHER PUBLICATIONS

Machine translated JP2001-209126A; Aug. 3, 2001.*

(Continued)

*Primary Examiner* — Wen-Ying P Chen
*(74) Attorney, Agent, or Firm* — Standley Law Group LLP (57) ABSTRACT

A system and method for cooling back to back electronic displays. Transparent first and second gas chambers are co-existive with the front display surfaces of the first and second electronic displays. A closed loop of isolated gas enters the first and second gas chambers and contacts the front surfaces of the electronic displays, where it may extract heat from the front display surfaces. The isolated gas is then directed into a cooling chamber where it is cooled and re-introduced into the first and second gas chambers. Fans may be used to propel the isolated gas through the cooling chamber and the first and second gas chambers. The circulating gas removes heat directly from the electronic display surfaces. The isolated gas is transparent or at least semi-transparent to ensure that the image quality of the electronic displays is minimally impacted.

20 Claims, 6 Drawing Sheets

Related U.S. Application Data

12/234,307, filed on Sep. 19, 2009, and a continuation-in-part of application No. 12/234,360, filed on Sep. 19, 2008, and a continuation-in-part of application No. 12/237,365, filed on Sep. 24, 2008, and a continuation-in-part of application No. 12/411,925, filed on Mar. 26, 2009, and a continuation-in-part of application No. 12/235,200, filed on Sep. 22, 2008, and a continuation-in-part of application No. 12/234,182, filed on Sep. 19, 2008.

(60) Provisional application No. 61/095,615, filed on Sep. 9, 2008, provisional application No. 61/033,058, filed on Mar. 3, 2008, provisional application No. 61/033,064, filed on Mar. 3, 2008, provisional application No. 61/053,713, filed on May 16, 2008, provisional application No. 61/057,599, filed on May 30, 2008, provisional application No. 61/115,333, filed on Nov. 17, 2008, provisional application No. 61/039,454, filed on Mar. 26, 2008, provisional application No. 61/076,126, filed on Jun. 26, 2008.

(56) References Cited

U.S. PATENT DOCUMENTS

| | | |
|---|---|---|
| 6,089,751 A | 7/2000 | Conover et al. |
| 6,157,432 A | 12/2000 | Helbing |
| 6,191,839 B1 | 2/2001 | Briley |
| 6,417,900 B1 | 7/2002 | Shin et al. |
| 6,535,266 B1 | 3/2003 | Nemeth et al. |
| 6,628,355 B1 | 9/2003 | Takahara |
| 6,839,104 B2 | 1/2005 | Taniguchi et al. |
| 6,885,412 B2 | 4/2005 | Ohnishi et al. |
| 6,943,768 B2 | 9/2005 | Cavanaugh et al. |
| 7,059,757 B2 | 6/2006 | Shimizu |
| 7,083,285 B2 | 8/2006 | Hsu |
| 2002/0101553 A1 | 8/2002 | Enomoto et al. |
| 2002/0126248 A1 | 9/2002 | Yoshida |
| 2003/0007109 A1 | 1/2003 | Park |
| 2004/0036834 A1 | 2/2004 | Ohnishi et al. |
| 2004/0165139 A1 | 8/2004 | Anderson et al. |
| 2006/0132699 A1 | 6/2006 | Cho |
| 2006/0209266 A1 | 9/2006 | Utsunomiya |
| 2007/0151664 A1 | 7/2007 | Shin |
| 2009/0153780 A1* | 6/2009 | Takata .................... 349/74 |

FOREIGN PATENT DOCUMENTS

| | | |
|---|---|---|
| JP | 08194437 | 7/1996 |
| JP | 11160727 | 6/1999 |
| JP | 2001209126 A * | 8/2001 |
| JP | 2002158475 | 5/2002 |
| JP | 2005134849 | 5/2005 |
| JP | 200829274 | 12/2008 |
| KR | 20060016469 | 2/2006 |
| KR | 100666961 | 1/2007 |
| KR | 1020070070675 | 7/2007 |
| WO | WO2005079129 | 8/2005 |

OTHER PUBLICATIONS

Zeef, Hubing, EMC analysis of 18' LCD Monitor, Aug. 2000, 1 page.

\* cited by examiner

SHARED ISOLATED GAS COOLING SYSTEM FOR OPPOSITELY FACING ELECTRONIC DISPLAYS

CROSS-REFERENCE TO RELATED APPLICATIONS

This application is a non-provisional application of U.S. Application No. 61/095,615 filed Sep. 9, 2008 and is hereby incorporated by reference. This application is also a continuation in part of U.S. patent application Ser. No. 11/941,728 filed Nov. 16, 2007, which is hereby incorporated by reference in its entirety. This application is also a continuation in part of U.S. patent application Ser. No. 12/191,834 filed Aug. 14, 2008, which claims priority to U.S. Application No. 61/033,058 filed Mar. 3, 2008 each of which is hereby incorporated by reference in its entirety. This application is also a continuation in part of U.S. patent application Ser. No. 12/234,307 filed Sep. 19, 2008, which claims priority to U.S. Application No. 61/033,064 filed Mar. 3, 2008 each of which is hereby incorporated by reference in its entirety. This application is also a continuation in part of U.S. patent application Ser. No. 12/234,360 filed Sep. 19, 2008, which claims priority to U.S. Application No. 61/053,713 filed May 16, 2008 each of which is hereby incorporated by reference in its entirety. This application is also a continuation in part of U.S. patent application Ser. No. 12/237,365 filed Sep. 24, 2008, which claims priority to U.S. Application No. 61/057,599 filed May 30, 2008 each of which is hereby incorporated by reference in its entirety. This application is a non-provisional application of U.S. Application No. 61/115,333 filed Nov. 17, 2008 and is hereby incorporated by reference. This application is also a continuation in part of U.S. patent application Ser. No. 12/411,925 filed Mar. 26, 2009, which claims priority to U.S. Application No. 61/039,454 filed Mar. 26, 2008 each of which is hereby incorporated by reference in its entirety. This application is also a continuation in part of U.S. patent application Ser. No. 12/235,200 filed Sep. 22, 2008, which claims priority to U.S. Application No. 61/076,126 filed Jun. 26, 2008 each of which is hereby incorporated by reference in its entirety. This application is also a continuation in part of U.S. patent application Ser. No. 12/234,182 filed Sep. 19, 2008, which claims priority to U.S. Application No. 61/033,064 filed Mar. 3, 2008 each of which is hereby incorporated by reference in its entirety.

TECHNICAL FIELD

Exemplary embodiments relate generally to cooling systems and in particular to cooling systems for electronic displays, and specifically to shared cooling systems for multiple electronic displays.

BACKGROUND OF THE ART

Conductive and convective heat transfer systems for electronic displays are known. These systems of the past generally attempt to remove heat from the electronic components (power modules, backlights, etc.) in a display through as many sidewalls of the display as possible. In order to do this, the systems of the past have relied primarily on fans for moving air past the electronic components to be cooled and out of the display. Other systems my use natural convection to transfer heat from the electronic components to the display housing and out of the display into the ambient air. While such heat transfer systems have enjoyed a measure of success in the past, improvements to displays, including the use of displays in outdoor applications, requires even greater cooling capabilities.

SUMMARY OF THE INVENTION

In particular, cooling devices for electronic displays of the past have generally used convective heat dissipation systems that function to cool the rear interior of the display by one or more fans and fins. When used outdoors or in warm ambient conditions, these systems are not adequate, especially when radiative heat transfer from the sun through a display window becomes a major factor. In many applications and locations 200 Watts or more of power through such a display window is common. Furthermore, the market is demanding larger screen sizes for displays. With increased electronic display screen size and corresponding display window size more heat will be generated and more heat will be transmitted into the displays.

In the past, many displays have functioned satisfactorily with ten or twelve inch screens. Now, many displays are in need of screens having sizes greater than or equal to twenty-four inches which may require improved cooling systems. For example, some outdoor applications call for seventy-inch screens and above. The dual effect of increased heat production from the larger screens, brighter backlights, and radiative heat transfer from the sun through the display window, make heat dissipation systems of the past, which attempt to cool only the rear interior of the display inadequate.

When used outdoors, or in warm ambient environments, a large fluctuation in temperature is common in the devices of the past. Such temperature fluctuation adversely affects the electronic components in these devices. Whereas the systems of the past attempted to remove heat only through the non-display sides of the electronic display, a preferred embodiment causes convective heat transfer from the face of the display as well. By the aspects described below, the exemplary embodiments have made consistent cooling possible for electronic displays having screens of sizes greater than twelve inches. For example, cooling of a 55 inch screen or greater can be achieved, even in extremely hot climates and in direct sunlight. Greater cooling capabilities are provided by the device and method described and shown in more detail below.

There is demand in the market for use of electronic displays in environs that experience heavy foot traffic (e.g. indoor or outdoor mallways and sidewalks) from consumers etc. An important consideration when placing electronic displays in these areas is the amount of space that the electronic display will occupy. It is unsatisfactory for the display to occupy a great deal of space. In the past smaller display screens were used satisfactorily, now however, there is demand for larger display sizes. It is also advantageous to display information in multiple directions; in the past this was accomplished by having multiple electronic display devices positioned back to back. While this could be done without unsatisfactory invasion of the consumer walkways when using smaller display sizes, larger display sizes require more space as each display will necessarily include its own cooling system and exterior housing.

With the embodiments herein, multiple electronic display units can be contained within one housing assembly and share a common cooling system. The resulting apparatus will have a more efficient footprint and will require less space than a system comprising two independent units situated back-to-back. The multiple display system may be placed such that the viewable surfaces of the displays are substantially perpendicular to the flow of traffic, resulting in a minimal invasion of the space necessary for consumer travel, while still allowing the observers to view the displayed information.

When placed in outdoor environments, large displays require more efficient thermal management systems than systems of the past due to increased heat generated by the display, increased ambient temperatures, and an increase in radiated heat from the sun absorbed through the larger display surface. However, when the sun travels above the top of the display, there is a resulting decrease in the amount of heat that the cooling system must dissipate. Thus the cooling system, in displays of the past, will be substantially idle for much of the day. Multiple display systems of the past utilize two displays situated substantially back-to-back, this results in the individual cooling systems each alternately dissipating heat at near optimal levels or at substantially below optimal levels for significant periods of the day. The resulting use of the cooling systems and the space required to house the cooling systems is suboptimal.

By utilizing a shared cooling system for multiple displays, more efficient use of the cooling system can be obtained. The amount of heat to be dissipated from the display that is not exposed to the radiated heat from the sun will be relatively small when compared to the amount of heat to be dissipated from the display exposed to the radiated heat. Thus the total amount of heat to be dissipated for the entire system will not be substantially larger than that of an isolated display. The spatial requirements of the shared system will be smaller than a system comprising multiple independent electronic display units together. The shared cooling system can dissipate the heat from the first display exposed to the sun, and as the amount of radiated heat absorbed by the first display decreases, the amount of radiated heat absorbed by the second display will correspondingly increase, but this will not result in a substantial increase in the total amount of heat that the cooling system needs to dissipate. Thus, the cooling system may operate at near optimal levels for a larger period of each day. Therefore, complimentary arrangement of the displays allows for a more efficient use of the cooling system.

An exemplary embodiment includes two electronic displays arranged substantially parallel to one another with the viewable surfaces facing out from the center of the system. The two displays share a common display cooling system. The displays and the cooling system may be contained within a common housing. An exemplary embodiment includes an isolated gas cooling chamber. The gas cooling chamber is preferably a closed system which includes; a first gas chamber comprising a first transparent exterior plate, a second gas chamber, essentially parallel to the first gas chamber, comprising a second transparent exterior plate and a cooling plenum central to the first two gas chambers. The first gas chamber is exterior to and coextensive with the viewable face of the first electronic display surface. The second gas chamber is exterior to and coextensive with the viewable face of the second electronic display surface.

The transparent plates may be separated from the electronic display surfaces by spacing members defining the depth of the each gas chamber. A cooling chamber fan, or equivalent means, may be located within the cooling plenum. The fan may be used to propel gas around the isolated gas cooling chamber loop. As the gas traverses the transparent gas chambers it contacts the electronic display surfaces, absorbing heat from the surface of the displays. Because the gas and the relevant surfaces of the gas chambers are transparent, the image quality remains excellent. After the gas has traversed the transparent gas chambers, the gas may be directed into the cooling plenum.

In order to cool the gas in the cooling plenum, external convective or conductive means may be employed. In at least one embodiment, an external fan unit may also be included within the housing of the display. The external fan unit may be positioned to provide a flow of ingested air over the external surfaces of the plenum. The heated air in the housing may exit the housing as exhaust.

The foregoing and other features and advantages of the present invention will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
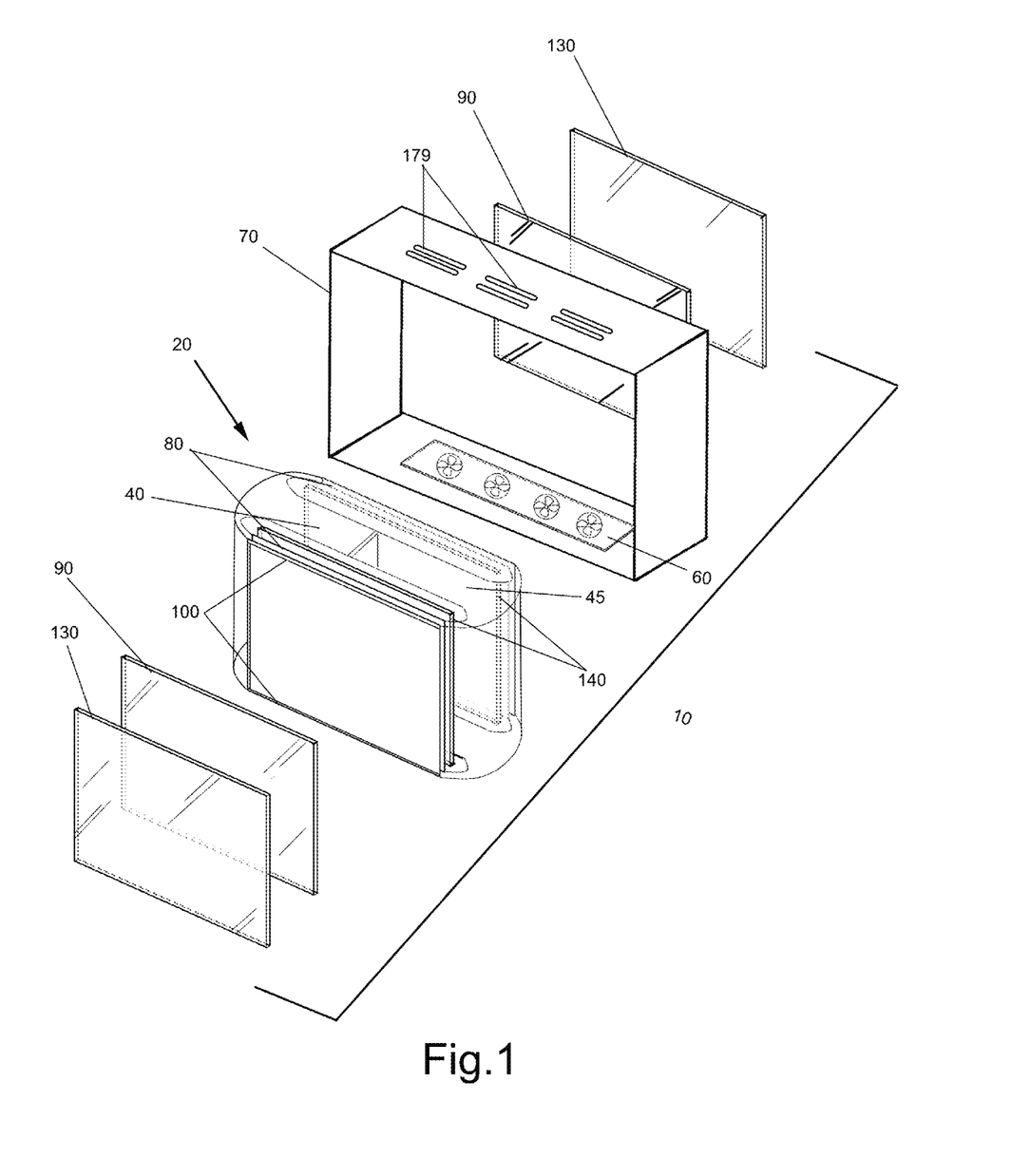
FIG. 1 is an exploded perspective view of an exemplary embodiment showing components of the isolated gas cooling system.

Referring to FIG. 1, the displays shown are equipped with an innovative gas cooling system. Accordingly, it may be placed in direct sunlight as well as warm ambient temperatures. As shown in FIG. 1 an exemplary embodiment 10 of the electronic display and gas cooling system includes an isolated gas cooling chamber 20 contained within an electronic display housing 70. In a preferred embodiment, the unit is substantially symmetrical with respect to the first and second gas chambers 30 and 31, thus features described for the first gas chamber 30 are similar to the features within the second gas chamber 31. Narrow transparent first gas chamber 30 and narrow transparent second gas chamber 31 may contain spacing members 100 and respective transparent front plates 90. A second transparent front plate 130 may be laminated to the exterior of transparent front plate 90 to help prevent breakage of front plate 90 or provide various optical properties (anti-reflection, polarization, phase retardation, etc.). As shown in FIG. 1, cooling chamber 20 surrounds the respective LCD stacks 80 and associated backlight panels 140 (if necessary, depending on the type of display). Note that the specific embodiments described here are for LCD displays, but any flat panel display will suffice.

The gas cooling system 10 shown in FIG. 1 may include means for cooling the isolated gas contained within the third gas chamber 40. This means may include a fan 60 which may be positioned at the base of the display housing 70. The fan will force the cooler ingested air over at least one external surface of a medial cooling plenum 45. If desired, an air conditioner (not shown) may also be utilized to cool the air which contacts the external surfaces of plenum 45, or components of the air conditioner may be placed within the cooling plenum 45 to cool the isolated gas directly. Also, a thermoelectric module (not shown) may be placed within the cooling plenum 45 in order to cool the isolated gas.

Figure 2:
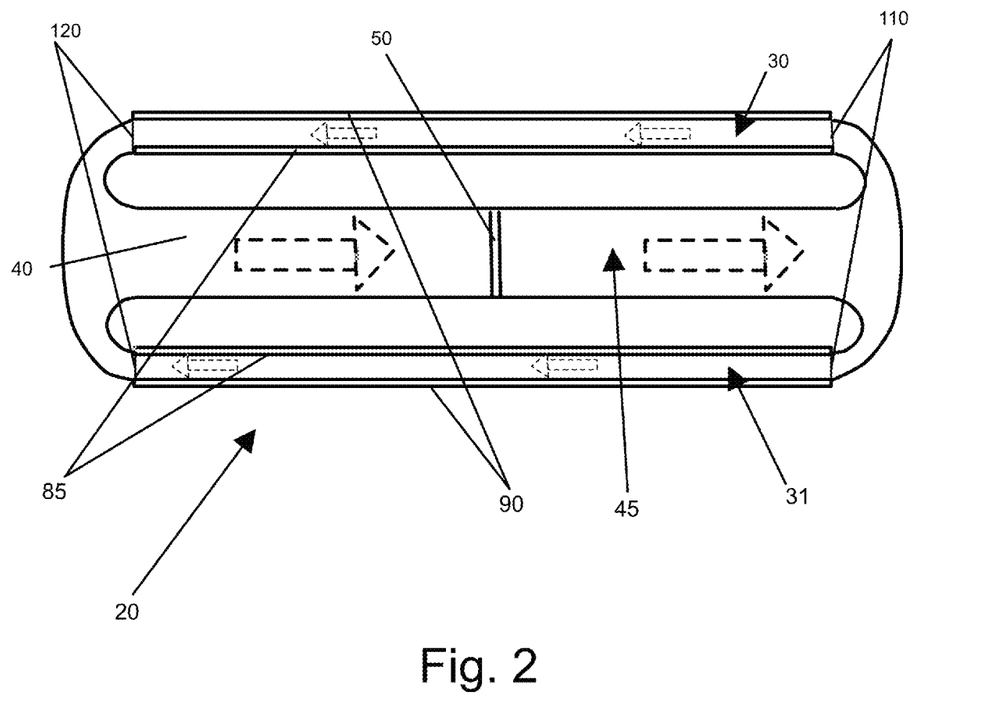
FIG. 2 is a cross-sectional top view through one exemplary embodiment

Referring to FIG. 2, in at least one embodiment the isolated gas cooling chamber 20 comprises a closed loop which includes the first gas chamber 30, an oppositely-facing second gas chamber 31 and a third gas chamber 40. Both the first and second gas chambers 30 and 31 include a transparent front plate 90. The third gas chamber 40 comprises a cooling plenum 45. The term "isolated gas" refers to the fact that the gas within the isolated gas cooling chamber 20 is essentially isolated from external air in the housing of the display. Because both the first gas chamber 30, and the second gas chamber 31 are positioned in front of the display image, the gas should be substantially free of dust and other contaminates that might negatively affect the display images.

The isolated gas may be almost any transparent gas, for example, normal air, nitrogen, helium, or any other transparent gas. The gas is preferably colorless so as not to affect the image quality. Furthermore, the isolated gas cooling chamber need not necessarily be hermetically sealed from the external air. It is sufficient that the gas in the chamber is isolated to the extent that dust and contaminates may not substantially enter the first gas chamber.

In the closed loop configuration shown in FIG. 2, both gas chambers 30 and 31, are in gaseous communication with the third gas chamber 40. A cooling chamber fan 50 may be provided within the plenum 45. The cooling fan 50 may be utilized to propel gas around the isolated gas cooling chamber 20. The first and second gas chambers 30 and 31, each include at least one front glass 90 mounted in front of an electronic display surface 85. The front glass 90 may be offset from the electronic display surface 85 by spacing members 100 (see FIG. 1). The spacing members 100 may define the depth of the narrow channel passing in front of each electronic display surface 85. The spacing members 100 may be independent or alternatively may be integral with some other component of the device (e.g., integral with the front plate or the display surface). Each electronic display surface 85, its respective spacing members 100 and transparent front plate 90 may comprise the narrow gas chambers 30 and 31. The chambers 30 and 31 are in gaseous communication with plenum 45 through entrance openings 110 and exit openings 120.

As shown in FIG. 2, the medial surface of the gas chambers 30 and 31 preferably comprises the electronic display surface 85 of the respective display stack 80. As the isolated gas in the first gas chamber 30 traverses the isolated loop it contacts the electronic display surface 85. Contacting the cooling gas directly to the electronic display surface 85 enhances the convective heat transfer away from the electronic display surface 85. A similar air passage and convection process occurs in the second gas chamber 31. Note that plenum 45 may have many possible shapes without departing from the exemplary embodiments.

Advantageously, in exemplary embodiments the respective electronic display surfaces 85 comprise the medial surface of each of the first and second gas chambers 30 and 31. Accordingly, the term "electronic display surface" refers to the front surface of a typical electronic display (in the absence of the embodiments disclosed herein). The display surface may be the exterior surface of a typical display after any polarizers, anti-reflective, phase retarder, or protective layers are added to the display assembly. Or the display surface may be a polarizer, phase retarder, reflective or protective layer. The term "viewable surface" or "viewing surface" refers to that portion of the electronic display surface from which the electronic display images may be viewed by the user.

The electronic display surface 85 of an exemplary display is glass. However, neither display surface 85, nor transparent front plate 90, nor optional second transparent front plate 130 need necessarily be glass. Therefore, the term "glass" will be used herein interchangeably with the term "plate." By utilizing the electronic display surface 85 as the interior surface wall of the gas chamber 30 and 31, there may be fewer surfaces to impact the visible light traveling through the display. Furthermore, the device will be lighter and cheaper to manufacture.

Although the embodiment shown utilizes the electronic display surface 85, certain modifications and/or coatings (e.g., anti-reflective coatings) may be added to the electronic display surface 85, or to other components of the system in order to accommodate the coolant gas or to improve the optical performance of the device. Additionally, the embodiments may include the use of a polarizer on either the transparent front plates 90, or the optional second transparent front plates 130, for absorbing radiated heat before it can reach the display surface or for anti-reflective purposes.

In the embodiment shown, the electronic display surface 85 may be the front plate of a liquid crystal display (LCD) stack. However, almost any display surface may be suitable for embodiments of the present cooling system. Although not required, it is preferable to allow the cooling gas in the first gas chamber 30 and the second gas chamber 31 to contact the electronic display surfaces 85 directly. In this way, the convective effect of the circulating gas will be maximized. Preferably the gas, which has absorbed heat from the electronic display surface 85 may then be diverted to the cooling plenum 45 where the collected heat energy in the gas may be dissipated into the air within the display housing 70 by conductive and or convective means.

To prevent breakage, the optional second surface glass 130 may be adhered to the front surface of glass 90. Alternatively surface glass 90 may be heat tempered to improve its strength. As shown in FIG. 2, fan 50 propels a current of air around the loops (see arrows) of the isolated gas cooling chamber 20. The plenum 45 defining the second gas chamber 40 is adapted to circulate the gas behind the electronic display surface 85. The plenum 45 preferably surrounds most of the heat generating components of the electronic display, for example, backlight panel 140 (see FIG. 1).

Figure 3:
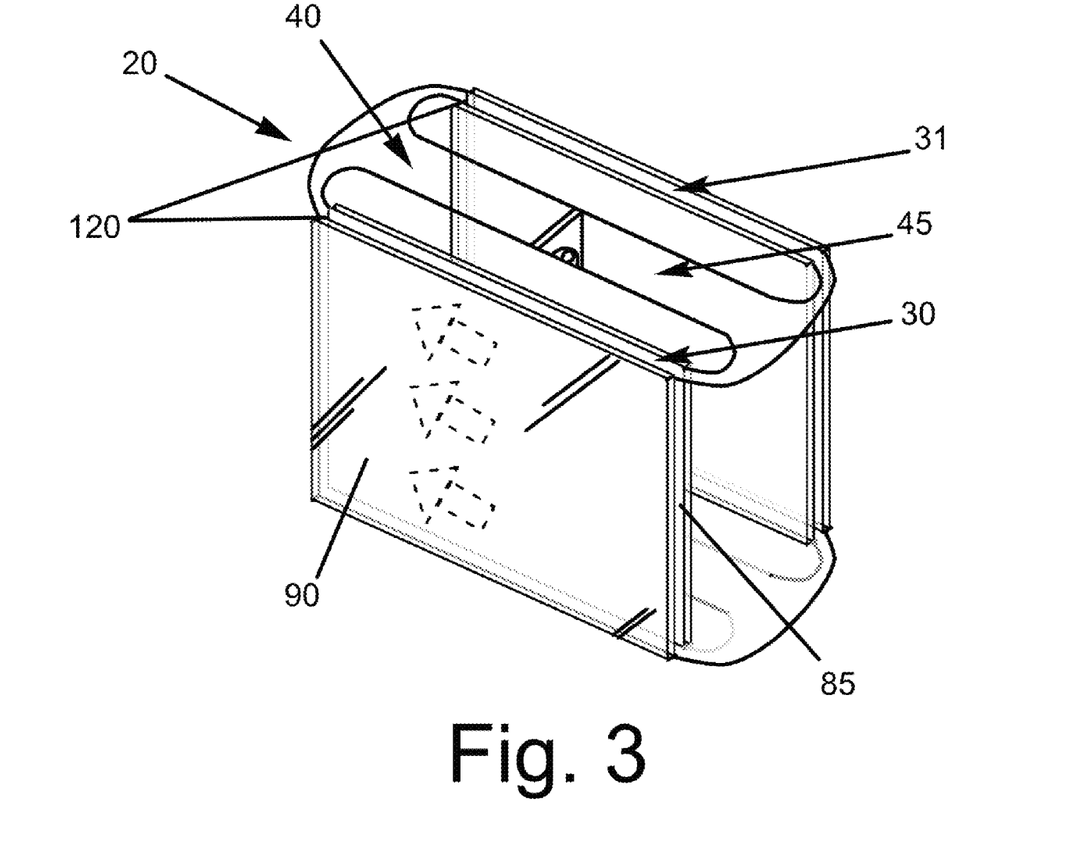
FIG. 3 is a front perspective view of an embodiment of the isolated cooling chamber, particularly the transparent exterior surface of first gas chamber.

FIG. 3 shows that the front plate 90 of the first gas chamber 30 is transparent and is positioned near the front of a viewable area of an electronic display surface 85. The arrows shown represent the movement of the isolated gas through the first gas chamber 30; a similar gas movement may be present in the second gas chamber 31. As shown, the isolated gas traverses both the first gas chamber 30 and the second gas chamber 31, in a horizontal direction. Although cooling system 20 may be designed to move the gas in either a horizontal or a vertical direction. The system may move air left to right, or alternatively, right to left.

As is clear from FIG. 3, to maximize the cooling capability of the system, the gas chambers preferably cover the entire viewable surface of the electronic display surface 85. Because the relevant surfaces of the gas chambers 30 and 31, as well as the gas contained therein are transparent, the image quality of the display remains excellent. Anti-reflective coatings may be utilized to minimize specular and diffuse reflectance. After the gas traverses the respective gas chamber (30 or 31) it exits through exit opening 120 and enters the cooling plenum 45.

Figure 4:
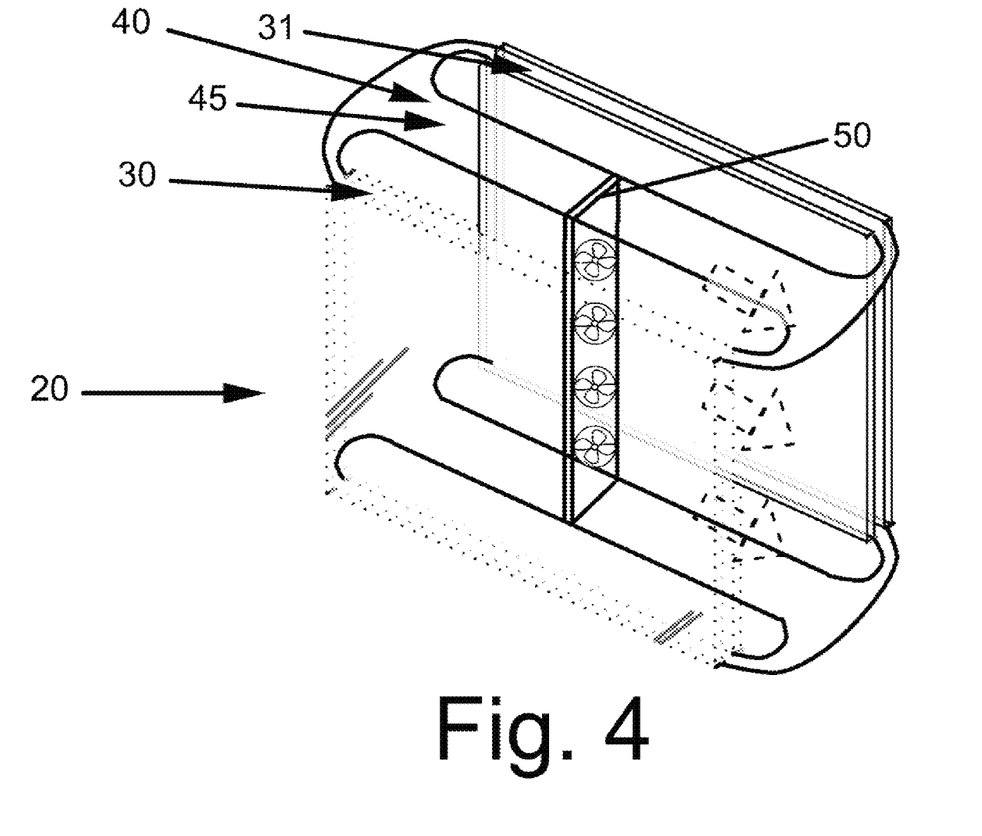
FIG. 4 is a perspective view of an embodiment of the isolated cooling chamber, particularly the cooling plenum.

FIG. 4 shows a schematic of the medial cooling plenum 45 (the first gas chamber 30 is illustrated as transparent for explanation). One or more fans 50 within the plenum may provide the force necessary to move the isolated gas through the isolated gas cooling chamber. Whereas the gas chambers 30 and 31 were designed to collect heat from the surface 85 of the display, the third gas chamber 40 is designed to dissipate that heat into the housing 70. Plenum 45 may have various contours and features to accommodate the internal structures within a given electronic display application.

Figure 5:
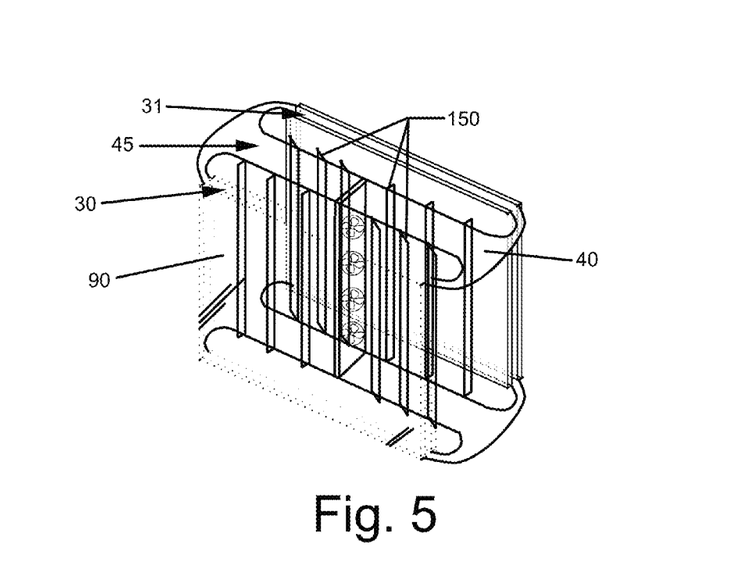
FIG. 5 is a perspective view of an embodiment of the isolated cooling chamber showing surface features that may be included on the plenum.
Figure 6:
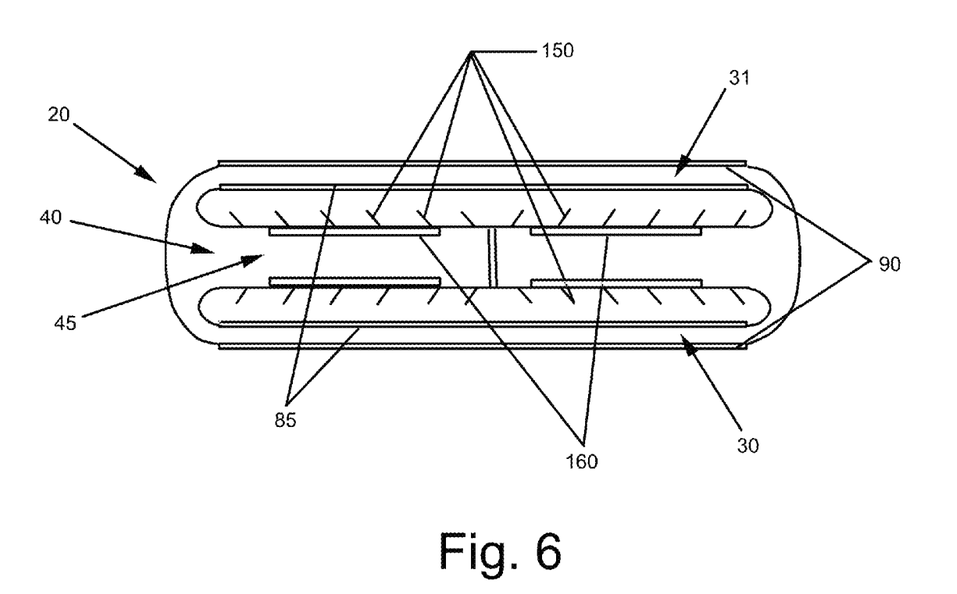
FIG. 6 is a top view of an exemplary embodiment of the cooling chamber showing surface features that may be included on the plenum.

As can be discerned in FIGS. 5 and 6, various surface features 150 may be added to improve heat dissipation from the plenum 45. These surface features provide more surface area to radiate heat away from the gas within the third gas chamber 40. These features 150 may be positioned at numerous locations on the surface of the plenum 45.

Figure 7:
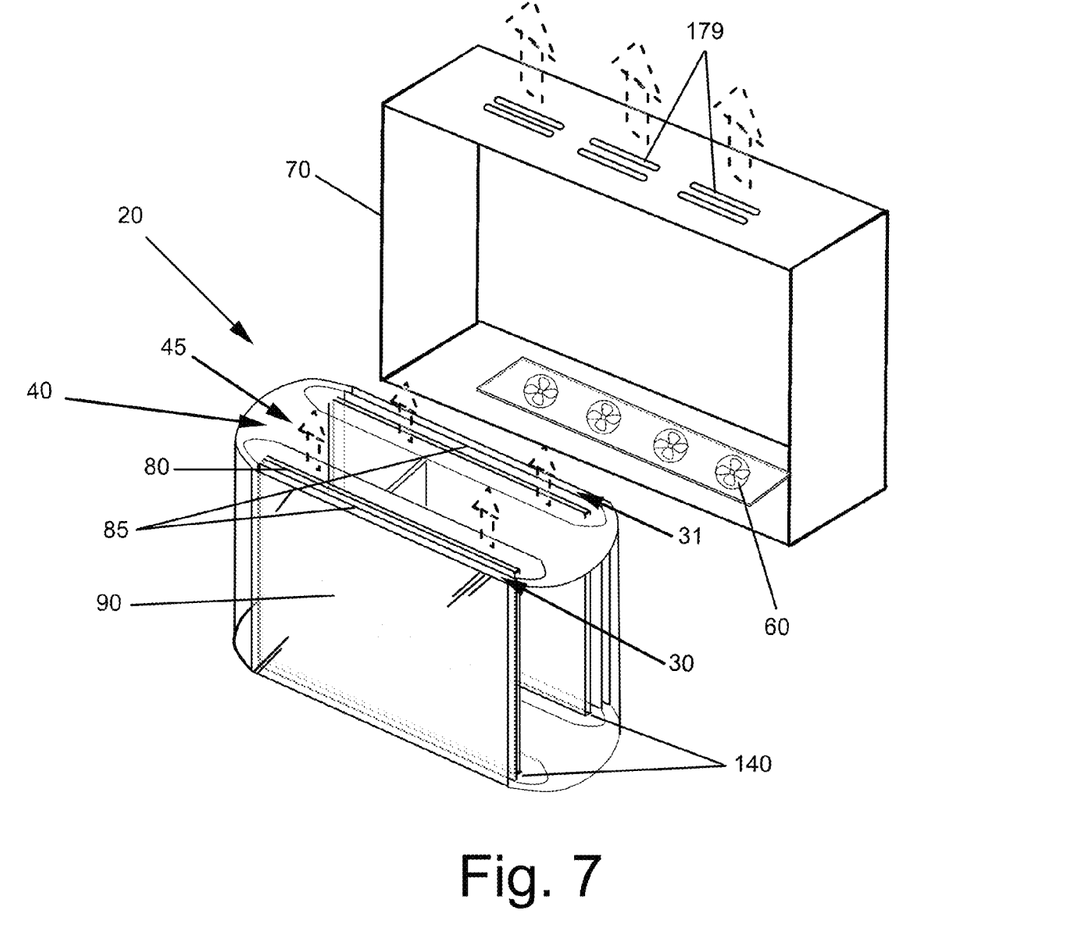
FIG. 7 is a perspective view of both the cooling system and the housing displaying optional components of the gas cooling system.

Referring to FIG. 6, one or more thermoelectric modules 160 may be positioned on at least one surface of the plenum 45 to further cool the gas contained in the third gas chamber 40. The thermoelectric modules 160 may be used independently or in conjunction with surface features 150. Alternatively, thermoelectric modules 160, or other heating elements, may be useful to heat the gas in the plenum if the unit is operated in extreme cold conditions. A closed loop gas system which is capable of heating the isolated gas is disclosed in co-pending application Ser. No. 12/235,200 filed on Sep. 22, 2008 which is herein incorporated by reference in its entirety. Heating elements can be placed within the third gas chamber 40 in order to heat the isolated gas in cold conditions. The heating elements can be, but are not limited to, any one of the following: nichrome wire or ribbon, screen printed metal/ceramic tracks deposited on ceramic insulated metal (generally steel) plates, CalRod (typically a fine coil of nichrome wire in a ceramic binder, sealed inside a tough metal shell), heat lamp, and Positive Thermal Coefficient (PTC) of resistance ceramic FIG. 7 shows an exemplary method for removing heat in the gas contained in the rear plenum 45. Fan 60 may be positioned to ingest external air and blow that air into the display housing 70. Preferably, the air will contact external surfaces of the plenum 45. Furthermore, in this configuration, fan 60 will also force fresh air past the heat generating components of the electronic display (e.g., the LCD stack 80 and the backlight 140) to further improve the cooling capability of the cooling system. The heated exhaust air may exit through one or more apertures 179 located on the display housing 70. The fan 60 may also force air-conditioned air into the display housing 70 and over the exterior surfaces of the plenum 45.

The embodiment exemplified by FIG. 7 may be used to create a constricted flow of air between the plenum 45 and the interior heat generating electronics of the display units (e.g., the LCD stack 80 and the backlight 140). Such a system is described in co-pending U.S. Application Nos. 61/115,333 filed on Nov. 17, 2008 and 12/411,925 filed on Mar. 26, 2009, which are hereby incorporated by reference.

Besides thermoelectric modules 160, there are a number of ways to cool the gas in the third gas chamber 40 by using devices within the chamber. For example air conditioners or other cooling means known by those skilled in the art may be placed within the plenum 45.

FIG. 7 illustrates a fan unit 60 forcing a flow of ingested air into the display housing 70. The air travels along the exterior surfaces of plenum 45. In the exemplary embodiment shown in FIG. 7, the exhaust air is directed to exit toward the exit apertures 179 of the display housing. In other embodiments, an optional air curtain device, such as that described in Co-pending application Ser. No. 11/941,728 filed on Nov. 16, 2007, herein incorporated by reference in its entirety, may be included to direct the exhaust air back across the external surface of the front glass 90 (or second front glass 130) of the cooling chamber. The external current of exhaust air may assist in removing even more heat from the gas chambers 30 and 31.

While the display is operational, the isolated gas cooling system may run continuously. However, if desired, a temperature sensor (not shown) and a switch (not shown) may be incorporated within the electronic display 10. This thermostat may be used to detect when temperatures have reached a predetermined threshold value. In such a case, the isolated gas cooling system may be selectively engaged when the temperature in the display reaches a predetermined value. Predetermined thresholds may be selected and the system may be configured with a thermostat (not shown) to advantageously keep the display within an acceptable temperature range.

An optional air filter (not shown) may be employed within the system to assist in preventing contaminates and dust from entering the gas chambers 30 and 31.

Exemplary embodiments of the isolated gas cooling system may also include various electronic components within the cooling plenum. Such an embodiment is described in co-pending U.S. application Ser. No. 12/234,360 filed on Sep. 19, 2008, and is hereby incorporated by reference in its entirety. In these embodiments, various electronic components may be placed within the plenum which can aid in the cooling of the electronic components as well as keep them protected from the elements. The size of the overall display may also be reduced. The electronic components may include but are not limited to: transformers, circuit boards, resistors, capacitors, batteries, power supplies, motors, illumination devices, wiring and wiring harnesses, and switches.

It is to be understood that the spirit and scope of the disclosed embodiments includes cooling of displays including, but not limited to LCDs. By way of example and not by way of limitation, the embodiments taught herein may be used in conjunction with displays selected from among LCD (including TFT or STN type), light emitting diode (LED), organic light emitting diode (OLED), field emitting display (FED), cathode ray tube (CRT), and plasma displays. Furthermore, embodiments may be used with displays of other types including those not yet discovered. In particular, it is contemplated that some embodiments may be well suited for use with full color, flat panel OLED displays. It should be noted, that while some of the embodiments herein have been described as having backlights for the display assemblies, some display types (such as plasma and OLED) do not require backlights and these embodiments would not utilize a backlight assembly. While the embodiments described herein are well suited for outdoor environments, they may also be appropriate for indoor applications (e.g., factory environments) where thermal stability of the display may be at risk, or where thermoregulation is a priority.

Having shown and described preferred embodiments, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. An isolated gas cooling system for a first and second electronic display, the system comprising:
   a first gas compartment placed at the front of the first display;
   a second gas compartment placed at the front of the second display;
   a third gas compartment in gaseous communication with the first and second gas compartments, said compartment having internal and external surfaces;
   a first fan within the third gas compartment which propels gas around the first, second, and third gas compartments; and
   a second fan which forces air over the external surfaces of the third gas compartment.

2. The cooling system of claim 1 wherein:
   the first gas compartment comprises:
      a display surface of the first electronic display;
      a transparent plate placed in front of the display surface;
      two spacing members between the display surface and the transparent plate; and
      an inlet and exit opening.

3. The cooling system of claim 2 wherein:
   the second gas compartment comprises:
      a display surface of the second electronic display;
      a transparent plate placed in front of the display surface;
      two spacing members between the display surface and the transparent plate; and
      an inlet and exit opening.

4. The cooling system of claim 1 wherein:
   the third gas compartment comprises a cooling plenum.

5. The cooling system of claim 1 wherein:
   the third gas compartment is placed between the first and second electronic displays.

6. The cooling system of claim 1 further comprising:
   a thermostat in electrical communication with the fan within the third gas compartment.

7. The cooling system of claim 1 further comprising:
   a particulate filter within the third gas chamber.

8. The cooling system of claim 4 further comprising:
   surface features attached to the plenum which aid in heat dissipation.

9. A thermally regulated dual-display system comprising:
   a first electronic display having a first display surface;
   a second electronic display having a second display surface where the first and second displays are back to back;
   a cooling plenum between the first and second displays;
   a first gas chamber placed in front of and co-existive with the first display surface and in gaseous communication with the cooling plenum;
   a second gas chamber placed in front of and co-existive with the second display surface and in gaseous communication with the cooling plenum;
   a fan within the cooling plenum which propels isolated gas through the cooling plenum and the first and second gas chambers; and
   a means for cooling the isolated gas.

10. The display system of claim 9 wherein:
    the means for cooling the isolated gas comprises a fan which forces air over external surfaces of the plenum.

11. The display system of claim 10 further comprising:
    a thermostat in electrical communication with the fan within the cooling plenum.

12. The display system of claim 11 further comprising:
    a particulate filter within the cooling plenum.

13. The display system of claim 9 further comprising:
    surface features attached to the plenum which aid in heat dissipation.

14. The display system of claim 9 wherein:
    the means for cooling the isolated gas comprises an air conditioning unit.

15. The display system of claim 9 wherein:
    the means for cooling the isolated gas comprises a thermoelectric module within the cooling plenum.

16. A method for cooling a first electronic display having a first display surface and a second electronic display having a second display surface where the first and second displays are back to back, the method comprising the steps of:
    providing an isolated gas system comprising a first gas chamber which is in contact with the first electronic display surface and a second gas chamber which is in contact with the second electronic display surface and a cooling plenum which is in gaseous communication with both the first and second gas chambers;
    forcing isolated gas into the first and second gas chambers;
    transferring heat from the first and second electronic display surfaces to the isolated gas;
    directing the isolated gas into the cooling plenum;
    cooling the isolated gas in the cooling plenum; and
    reintroducing the cooled isolated gas into the first and second gas chambers.

17. The method of claim 16, wherein the cooling step comprises the steps of:
    transferring heat from the isolated gas to the walls of the cooling plenum; and
    forcing air over the external surfaces of the plenum.

18. The method of claim 17, further comprising the step of:
    air conditioning the air before forcing it over the external surfaces of the plenum.

19. The method of claim 17, further comprising the step of:
    filtering the isolated gas prior to forcing it into the first and second chambers.

20. The method of claim 16 wherein:
    the step of cooling the isolated gas in the cooling plenum comprises transferring heat from the isolated gas to a thermoelectric module within the cooling plenum.

* * * * *